(12) United States Patent
Genz et al.

(10) Patent No.: US 7,141,507 B2
(45) Date of Patent: Nov. 28, 2006

(54) METHOD FOR PRODUCTION OF A SEMICONDUCTOR STRUCTURE

(75) Inventors: Oliver Genz, Dresden (DE); Markus Kirchhoff, Ottendorf-Okrilla (DE); Stephan Machill, Dresden (DE); Alexander Reb, Dresden (DE); Barbara Schmidt, Dresden (DE); Momtchil Stavrev, Dresden (DE); Maik Stegemann, Dresden (DE); Stephan Wege, Dresden (DE)

(73) Assignee: Infineon Technologies AG, München (DE)

( * ) Notice: Subject to any disclaimer, the term of this patent is extended or adjusted under 35 U.S.C. 154(b) by 82 days.

(21) Appl. No.: 11/065,342

(22) Filed: Feb. 25, 2005

(65) Prior Publication Data

US 2005/0196952 A1    Sep. 8, 2005

Related U.S. Application Data

(63) Continuation of application No. PCT/EP03/09551, filed on Aug. 28, 2003.

(30) Foreign Application Priority Data

Aug. 30, 2002   (DE) .............................. 102 40 099.7

(51) Int. Cl.
*H01L 21/302* (2006.01)
(52) U.S. Cl. ...................... 438/719; 438/689; 430/312; 430/313
(58) Field of Classification Search ............... 438/689, 438/706, 719, 723, 724, 725; 430/311, 312, 430/313

See application file for complete search history.

(56) References Cited

U.S. PATENT DOCUMENTS

| 5,422,205 | A | * | 6/1995 | Inoue et al. .................... 430/5 |
| 5,466,639 | A | | 11/1995 | Ireland |
| 5,821,169 | A | | 10/1998 | Nguyen et al. |
| 5,981,398 | A | | 11/1999 | Tsai et al. |
| 6,143,476 | A | | 11/2000 | Ye et al. |
| 6,225,217 | B1 | | 5/2001 | Usami et al. |
| 6,340,435 | B1 | | 1/2002 | Bjorkman et al. |
| 6,541,166 | B1 | * | 4/2003 | Mansfield et al. ............. 430/5 |

(Continued)

FOREIGN PATENT DOCUMENTS

| DE | 42 01 661 A1 | 1/1992 |
| EP | 1 184 903 A1 | 3/2002 |

(Continued)

*Primary Examiner*—Kin-Chan Chen
(74) *Attorney, Agent, or Firm*—Morrison & Foerster LLP

(57) ABSTRACT

A method for producing a semiconductor structure including preparing a semiconductor substrate, and generating a lower first, a middle second and an upper third masking layer on a surface of the semiconductor substrate. The method further includes forming at least one first window in the upper third masking layer, structuring the middle second masking layer using the first window for transferring the first window, structuring the lower first masking layer using the first window for transferring the first window, and enlarging the first window to form a second window. The method for further includes restructuring the middle second masking layer using the second window for transferring the second window, structuring the semiconductor substrate, using the structured lower third masking layer, restructuring the lower first masking layer using the second window, and restructuring the semiconductor substrate using the restructured lower third masking layer.

14 Claims, 4 Drawing Sheets

U.S. PATENT DOCUMENTS

Figure 1A:
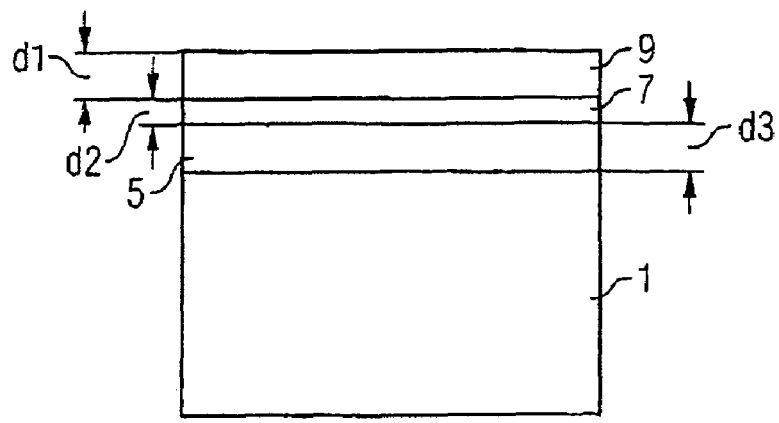

| | | |
|---|---|---|
| 2001/0001056 A1* | 5/2001 | Magome ................... 430/22 |
| 2001/0036732 A1* | 11/2001 | Yoshida et al. ............ 438/689 |
| 2002/0081854 A1 | 6/2002 | Morrow et al. |
| 2004/0127037 A1* | 7/2004 | Lee ........................... 438/689 |
| 2004/0157164 A1* | 8/2004 | Hasegawa et al. ......... 430/312 |

FOREIGN PATENT DOCUMENTS

| | | |
|---|---|---|
| TW | 479294 B | 3/2002 |
| WO | WO 00/03432 | 1/2000 |

* cited by examiner

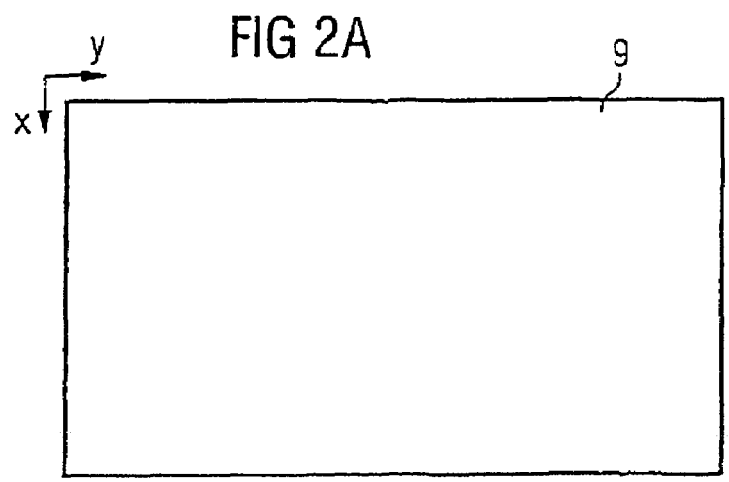
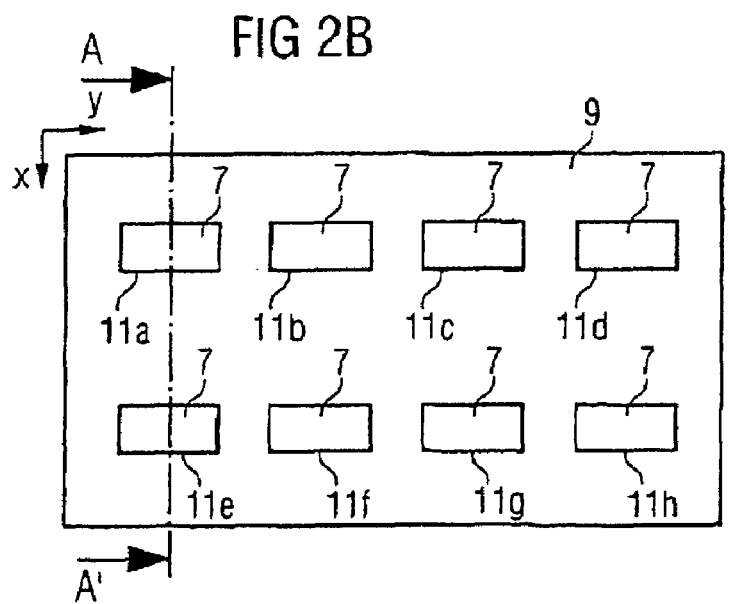
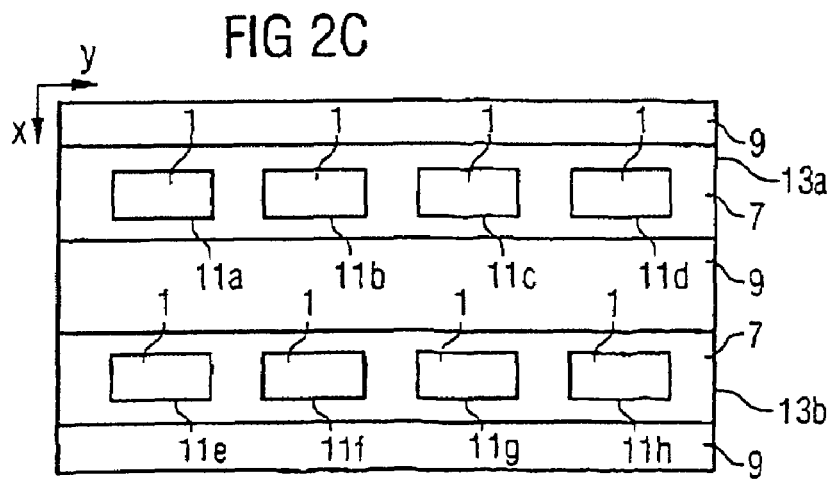

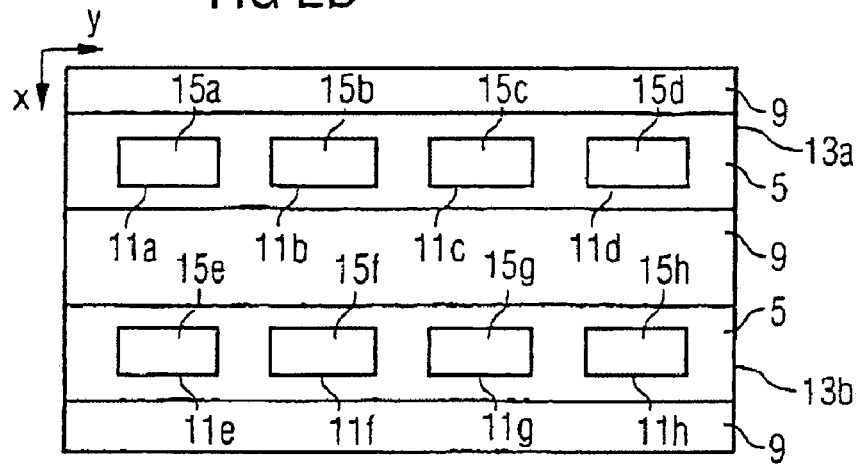
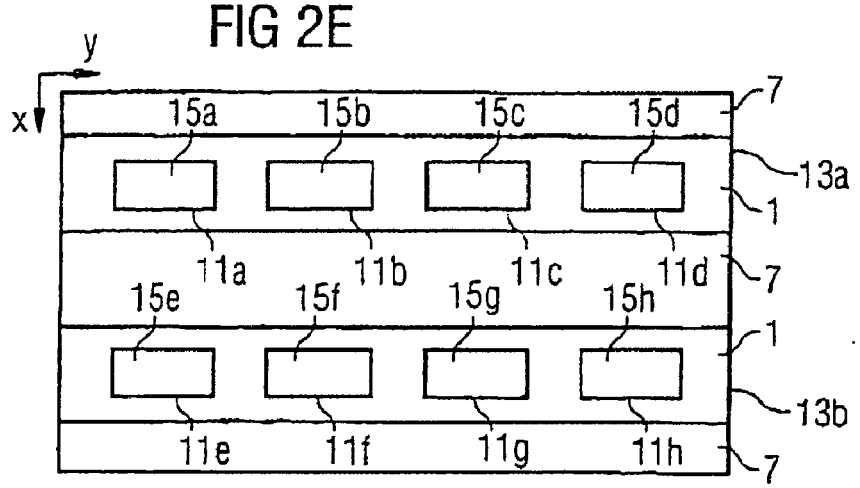
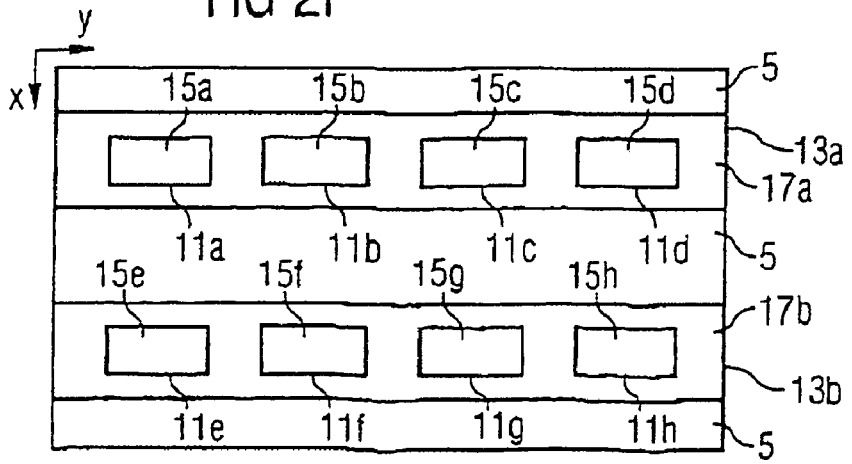

METHOD FOR PRODUCTION OF A SEMICONDUCTOR STRUCTURE

CLAIM FOR PRIORITY

This application is a continuation of PCT/EP2003/009551, published in the German language on Aug. 28, 2003, which claims the benefit of priority to German Application No. 102 40 099.7, filed on Aug. 30, 2002.

TECHNICAL FIELD OF THE INVENTION

The present invention relates to a method for production of a semiconductor structure.

BACKGROUND OF THE INVENTION

Although in principle applicable to any integrated circuits, the present invention and the problems on which it is based are explained with reference to semiconductor structures in silicon technology.

The patterning of semiconductor structures in silicon technology is effected by alternate production of masks, e.g. by exposing and developing photoresist layers, and dry-chemical or wet-chemical isotropic or anisotropic etching. Each lithography step or each lithography level is expensive and complex. Therefore, the aim of semiconductor fabrication is to minimize the number of lithography steps or lithography levels. As well as costs and feature size, another limiting factor in lithographic patterning is the accuracy of the vertical alignment of two or more lithography levels located above one another.

Hitherto, it has been customary for a new photoresist layer to be applied for each level which is to be lithographically patterned and for this photoresist layer to be exposed via a mask and then developed after alignment. Then, after the exposed or unexposed photoresist regions have been removed in the developing process, the semiconductor layer beneath the photoresist mask is patterned by means of a suitable etching process, for example by means of reactive ion etching.

SUMMARY OF THE INVENTION

The present invention provides an improved method for production of a semiconductor structure which allows fewer lithography steps or lithography levels to be provided.

One advantage of the invention is that only a single lithography level for patterning the upper, third mask layer is required to transfer two different trench structures into a semiconductor substrate.

In one embodiment of the invention, the window is transferred in the upper, third mask layer into the mask layers beneath it and in widening this window at a defined location in a self-aligning manner using a maskless process step and also transferring the widened window into the mask layers below, and in patterning the substrate using the window and the widened window in succession.

According to a preferred embodiment, the patterning of the lower, first mask layer using the first window in the middle, second mask layer in order to transfer the first window into the lower, first mask layer and the increasing of the size of the first window in the upper, third mask layer are carried out simultaneously in a single etching step which is selective with respect to the semiconductor substrate and with respect to the middle, second mask layer.

According to a further preferred embodiment, the patterning of the semiconductor substrate using the patterned lower, third mask layer and the repatterning of the middle, second mask layer using the second window in the upper, third mask layer in order to transfer the second window into the middle, second mask layer are carried out simultaneously in a single etching step which is selective with respect to the lower, first mask layer and with respect to the middle, second mask layer.

According to a further preferred embodiment, during the patterning of the semiconductor substrate a first trench is created, and during the repatterning of the semiconductor substrate a second, wider and shallower trench is created.

According to a further preferred embodiment, the semiconductor substrate consists of silicon oxide, the lower, first mask layer consists of carbon, the middle, second mask layer consists of silicon oxynitride, and the upper, third mask layer consists of photoresist.

According to a further preferred embodiment, the semiconductor substrate consists of silicon oxide, the lower, first mask layer consists of polysilicon, the middle, second mask layer consists of silicon oxide and the upper, third mask layer consists of photoresist.

According to a further preferred embodiment, the semiconductor substrate consists of silicon oxide, the lower, first mask layer consists of polysilicon, the middle, second mask layer consists of silicon nitride and the upper, third mask layer consists of photoresist.

According to a further preferred embodiment, the semiconductor substrate consists of silicon oxide, the lower, first mask layer consists of silicon nitride, the middle, second mask layer consists of polysilicon and the upper, third mask layer consists of photoresist.

According to a further preferred embodiment, the semiconductor substrate consists of silicon, the lower, first mask layer consists of silicon nitride, the middle, second mask layer consists of silicon oxide and the upper, third mask layer consists of photoresist.

According to a further preferred embodiment, a plurality of first windows is formed in the upper, third mask layer.

According to a further preferred embodiment, the plurality of first windows is increased in size to form a corresponding plurality of second windows in the maskless process step.

According to a further preferred embodiment, the plurality of first windows is increased in size to form a reduced number of second windows in the maskless process step as a result of at least some of the first windows being joined together when their size is increased.

According to a further preferred embodiment, the first windows are arranged in one or more rows, and the windows in each case belonging to the same row are joined together to form in each case a strip.

According to a further preferred embodiment, the semiconductor substrate is an intermetal dielectric.

BRIEF DESCRIPTION OF THE INVENTION

Exemplary embodiments of the invention are illustrated in the drawings and explained in more detail in the description which follows. In the drawings:

FIGS. 1a–f show successive method stages involved in a method for production of a semiconductor structure as a first embodiment of the present invention.

FIGS. 2a–f show method stages involved in a method for production of a semiconductor structure as a second embodiment of the present invention.

In FIGS. 1 and 2, identical reference symbols denote identical or functionally equivalent parts.

DETAILED DESCRIPTION OF THE INVENTION

FIGS. 1a–f show successive method stages involved in a method for production of a semiconductor structure as a first embodiment of the present invention.

In FIG. 1a, reference numeral 1 denotes a semiconductor substrate of silicon oxide ($SiO_2$). For reasons of simplicity, this semiconductor substrate 1 is shown without a silicon wafer beneath it or other layers beneath it, to which the silicon oxide semiconductor structure 1 has been applied by an oxidation process, a deposition process, an epitaxy process, a direct-bonding process or the like.

In a first method step, a lower, first mask layer 5 of carbon with a thickness d3, a middle, second mask layer 7 of silicon oxynitride with a thickness d2 and an upper, third mask layer 9 of photoresist with a thickness d1 are provided on the semiconductor substrate 1. It is customary for the mask layers 5 and 7 to be deposited and for the mask layer 9 to be spun on.

Figure 1B:
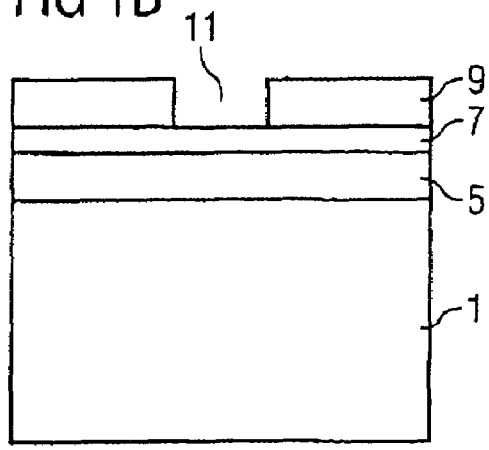

Then, referring to FIG. 1b, a first window 11 is formed in the upper, third mask layer 9 of photoresist in a standard lithography step using an exposure mask (not shown). This is made easier by the fact that the middle, second mask layer 7 of silicon oxynitride has antireflection properties (ARC).

Figure 1C:
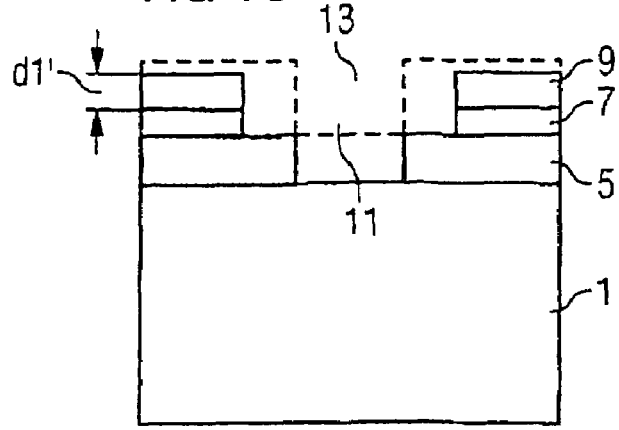

In the following method step, which is illustrated in FIG. 1c, a first etch is carried out on the middle, second mask layer 7 of silicon oxynitride, selectively with respect to the mask layer 9 of photoresist, in order to transfer the first window 11 in the upper, third mask layer 9 of photoresist into the middle, second mask layer 7 of silicon oxynitride. This initially leads to the process state indicated by the dashed line in FIG. 1c. This first etch, incidentally, is expediently carried out by means of reactive ion etching.

Then, in a subsequent step, a second etch is carried out in order to etch the lower, first mask layer 5 of carbon selectively with respect to the middle, second mask layer 7 of silicon oxynitride in order for the first window 11 to be transferred further into the lower, first mask layer 5.

One particular feature of this first embodiment is that this second etch, although selective with respect to the middle, second mask layer 7 of silicon oxynitride, is not selective with respect to the upper, third mask layer 9 of photoresist. The result of this is that on the one hand the first window 11 is transferred into the lower, first mask layer 5 of carbon, with the second etch being selected in such a manner that it stops on the semiconductor substrate 1 of $SiO_2$, but on the other hand at the same time the second etch also trims the upper, third mask layer 9 of photoresist. In this context, the term trimming means that the thickness d1 is reduced to a thickness d1' and at the same time the first window 11 in the upper, third mask layer 9 is widened to a second window 13 of greater width.

In other words, at the same time as the first, lower mask layer 5 is being etched, the patterning of the upper, third mask layer 9 is altered in situ and in a self-aligning manner. This second etch of the first, lower mask layer 5 of carbon, given the mask layer materials selected, is expediently carried out using an oxygen-containing gas mixture in the plasma.

After this second etch has stopped at the semiconductor substrate 1 of $SiO_2$, further overetching can be carried out within a defined extent without altering the critical dimension, i.e. the width of the first window 11 in the lower, first mask layer 5 of carbon. The increase in the size of the first window 11 in the upper, third mask layer 9 of photoresist can in this case be set as a function of this overetch time within the defined extent.

In this context, it should be noted, however, that as an alternative it is also possible for the upper, third mask layer 9 to be etched in a separate, maskless etching step if this third layer consists of a material which can be etched selectively with respect to the materials beneath it.

Figure 1D:
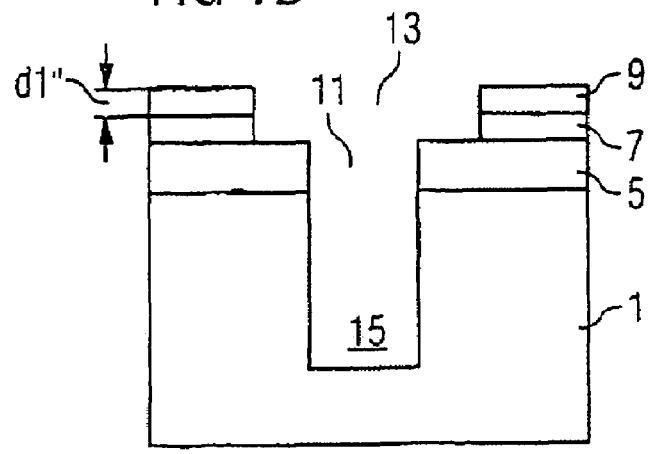

Continuing now with reference to FIG. 1d, in a subsequent etching step a trench 15 is then etched in the semiconductor substrate 1 of $SiO_2$ using the first window 11 in the lower, first mask layer 5 of carbon. It is expedient for the middle, second mask layer 7 of silicon oxynitride to be removed from the region which is no longer covered with photoresist at the same time during this etching step. In other words, therefore, the second window 13 is transferred from the upper, third mask layer 9 of photoresist into the middle, second mask layer 7 of silicon oxynitride simultaneously with the etching of the semiconductor substrate 1 of $SiO_2$. In this etching step, which is explained with reference to FIG. 1d, the thickness of the upper, third mask layer 9 decreases further to a thickness d1".

In this context, it should also be noted that given corresponding selectivity of the etches, it would also be possible for the provision of the trench 15 in the semiconductor substrate 1 and the transfer of the window 13 into the middle, second mask layer 7 in principle to be carried out in two separate etching steps.

Figure 1E:
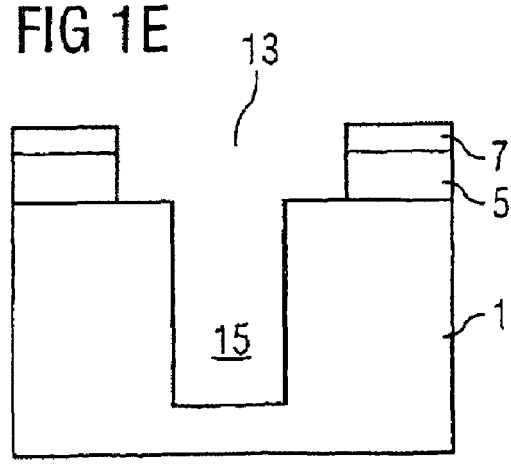
Figure 1F:
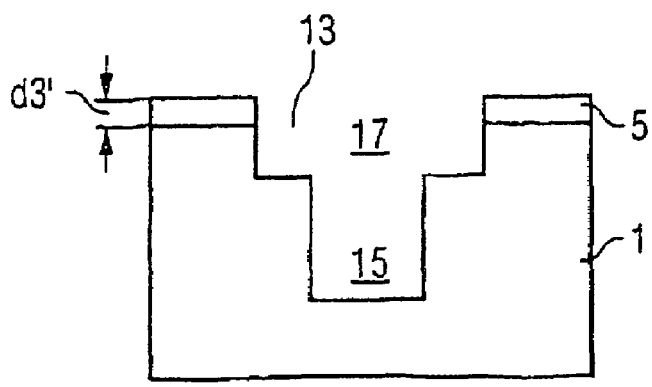

Continuing then with reference to FIG. 1e, the lower, first mask layer 5 of carbon is then etched in order for the second window 13 to be transferred to it. This etch, as mentioned above in connection with FIG. 1c, is selective with respect to the middle, second mask layer 7 of silicon oxynitride and is not selective with respect to the upper, third mask layer 9 of photoresist. Therefore, the upper, third mask layer 9 of photoresist is completely removed in this etching step. On account of this selectivity, the etch stops at the surface of the semiconductor substrate 1 of silicon dioxide and at the surface of the middle, second mask layer 7.

A subsequent etch of the semiconductor substrate 1 of silicon dioxide using the window 13 in the lower, first mask layer 5 of carbon therefore allows a second structure, in the form of a wider but shallower trench 17, to be transferred to the semiconductor substrate 1.

In view the above, a single lithography level for patterning the upper, third mask layer 9 of photoresist is required to transfer two different trench structures 15, 17 into the semiconductor substrate 1.

FIGS. 2a–f show successive method stages involved in a method for production of a semiconductor structure as a second embodiment of the present invention.

The second embodiment shown in FIGS. 2a to 2h illustrates that highly advantageous interlinked structures can be formed in the plane of the mask layers by the invention. FIGS. 2a to 2h illustrate this by means of a plan view of the top side of the semiconductor substrate 1, on which the three mask layers 5, 7, 9 are located. FIGS. 2a to 2h correspond to their associated pair in FIGS. 1a to 1h.

As shown in FIG. 2a, in the initial stage the entire surface is covered with the top, third mask layer 9 of photoresist.

Then, referring now to FIG. 2b, a plurality of first windows 11a to 11h are formed in the upper, third mask layer 9 of photoresist using the exposure mask (not shown) in the customary lithography step. To establish the paired relationship between FIGS. 1a to 1h and FIGS. 2a to 2h, it can be imagined that FIGS. 1a to 1h represent a cross section on line A—A' in FIG. 2b.

The plurality of first windows 11a to 11h have rectangular dimensions and the distances between them are greater in the x direction than in the y direction.

Then, in a subsequent method step, illustrated in FIG. 2c, the two etches, which have been explained extensively with reference to FIG. 1c, are carried out.

One particular feature of the arrangement of the first windows 11a to 11h in the second embodiment is that the distances between the first windows 11a to 11h in the y direction or the overetch time are selected in such a manner that the resulting second windows in each case merge into one another so as to form strips 13a, 13b, as illustrated in FIG. 2c.

In general terms, two situations can be envisaged for the arrangement of the first windows. If the first windows are well away from one another or if the overetch time is short enough, scaled window shapes in structures of different sizes are formed in the xy plane. However, if the individual first windows are less than a defined distance away from one another or if the etching time is long enough, they merge into one another in the xy plane.

In this way, it is possible to produce what are known as dual damascene structures using a single lithography step and with perfect alignment.

Then, in accordance with FIG. 2d, in a subsequent etching step analogous to FIG. 1b, a plurality of individual trenches 15a to 15h are etched in the semiconductor substrate 1 of $SiO_2$ using the lower, first mask layer 5 of carbon. In this step, the middle, second mask layer 7 of silicon oxynitride is also removed from the region which is no longer covered with photoresist.

Then, as shown in FIG. 2e, the etch of the lower, first mask layer 5 of carbon is carried out in order to transfer the two second windows 13a, 13b in strip form into the lower, first mask layer 5. The subsequent etching of the semiconductor substrate 1 of silicon dioxide using the windows 13a, 13b in strip form in the bottom, first mask layer 5 of carbon therefore allows the formation of a structure of two trench-like strips 17a, 17b in the semiconductor substrate 1, connecting the trenches 15a to 15h to one another, with the trench-like strips 17a, 17b being shallower than the trenches 15a–h.

An arrangement of this type would, for example, be extraordinarily expedient for the formation of vias and connecting interconnects in an intermetal dielectric in the form of silicon oxide or another dielectric when used as intermetal dielectric. In this case, a metal layer, e.g. tungsten, could be deposited over the entire surface of the semiconductor substrate 1, from which the mask layers have been removed, and then polished back to the surface of the semiconductor substrate in order to produce the vias and connecting interconnects.

Although the present invention has been described above on the basis of a preferred exemplary embodiment, it is not restricted to this embodiment, but rather can be modified in various ways.

In particular, the choice of mask and substrate materials and their arrangement are only examples and can be varied in numerous ways.

Although in the first embodiment above, the mask layer system comprised a lower, first mask layer of carbon, a middle, second mask layer of silicon oxynitride, and a third, upper mask layer of photoresist, this is not imperative.

In general terms, what is required is a first hard mask layer and a second hard mask layer which can be etched selectively with respect to one another, with respect to the semiconductor substrate and with respect to the upper, third mask layer of photoresist. This is usually always achievable, since photoresist can be etched just with oxygen plasma with respect to silicon, silicon oxide, silicon nitride. Therefore, further examples of mask layer systems would include photoresist/silicon oxide/polysilicon/silicon oxide; photoresist/silicon nitride/polysilicon/silicon oxide; photoresist/poly-silicon/silicon nitride/silicon oxide for silicon oxide as substrate, and photoresist/silicon oxide/silicon nitride/silicon for polysilicon or monocrystalline silicon as substrate.

In particular, it should also be mentioned that the use of the method according to the invention is not restricted to intermetal dielectrics, but rather can be employed at any desired point in the patterning of semiconductor structures.

LIST OF REFERENCE SYMBOLS

1 Silicon dioxide semiconductor substrate
5 First hard mask layer of carbon
7 Second hard mask layer of sion
9 Resist mask layer
11, 11a–h First window
13, 13a–b Second window
15, 15a–h First trenches
17, 17a–b Second trenches
x, y Directions

What is claimed is:

1. A method for production of a semiconductor structure, comprising:
   making available a semiconductor substrate;
   providing a lower, first mask layer, a middle, second mask layer and an upper, third mask layer on a surface of the semiconductor substrate;
   forming at least one first window in the upper, third mask layer;
   patterning the middle, second mask layer using the first window in the upper, third mask layer to transfer the first window into the middle, second mask layer;
   patterning the lower, first mask layer using the first window in the middle, second mask layer to transfer the first window into the lower, first mask layer;
   increasing the size of the first window in the upper, third mask layer to form a second window in the upper, third mask layer in a maskless process step;
   repatterning the middle, second mask layer using the second window in the upper, third mask layer to transfer the second window into the middle, second mask layer;
   patterning the semiconductor substrate using the patterned lower, third mask layer;
   repatterning the lower, first mask layer using the second window in the middle, second mask layer; and
   repatterning the semiconductor substrate using the repatterned lower, third mask layer.

2. The method as claimed in claim 1, wherein the patterning of the lower, first mask layer using the first window in the middle, second mask layer to transfer the first window into the lower, first mask layer and the increasing of the size of the first window in the upper, third mask layer are carried out simultaneously in a single etching step which is selective with respect to the semiconductor substrate and with respect to the middle, second mask layer.

3. The method as claimed in claim 1, wherein the patterning of the semiconductor substrate using the patterned lower, third mask layer and the repatterning of the middle, second mask layer using the second window in the upper, third mask layer to transfer the second window into the middle, second mask layer are carried out simultaneously in a single etching step which is selective with respect to the lower, first mask layer and with respect to the middle, second mask layer.

4. The method as claimed in claim 1, wherein during the patterning of the semiconductor substrate a first trench is created, and during the repatterning of the semiconductor substrate a second, wider and shallower trench is created.

5. The method as claimed in claim 1, wherein the semiconductor substrate consists of silicon oxide, the lower, first mask layer consists of carbon, the middle, second mask layer consists of silicon oxynitride, and the upper, third mask layer consists of photoresist.

6. The method as claimed in claim 1, wherein the semiconductor substrate consists of silicon oxide, the lower, first mask layer consists of polysilicon, the middle, second mask layer consists of silicon oxide and the upper, third mask layer consists of photoresist.

7. The method as claimed in claim 1, wherein the semiconductor substrate consists of silicon oxide, the lower, first mask layer consists of polysilicon, the middle, second mask layer consists of silicon nitride and the upper, third mask layer consists of photoresist.

8. The method as claimed in claim 1, wherein the semiconductor substrate consists of silicon oxide, the lower, first mask layer consists of silicon nitride, the middle, second mask layer consists of polysilicon and the upper, third mask layer consists of photoresist.

9. The method as claimed in claim 1, wherein the semiconductor substrate consists of silicon, the lower, first mask layer consists of silicon nitride, the middle, second mask layer consists of silicon oxide and the upper, third mask layer consists of photoresist.

10. The method as claimed in claim 1, wherein a plurality of first windows is formed in the upper, third mask layer.

11. The method as claimed in claim 10, wherein the plurality of first windows is increased in size to form a corresponding plurality of second windows in the maskless process step.

12. The method as claimed in claim 10, wherein the plurality of first windows is increased in size to form a reduced number of second windows in the maskless process step as a result of at least some of the first windows being joined together when their size is increased.

13. The method as claimed in claim 12, wherein the first windows are arranged in one or more rows, and the windows in each case belonging to the same row are joined together to form in each case a strip.

14. The method as claimed in claim 1, wherein the semiconductor substrate is an intermetal dielectric.

* * * * *